(12) United States Patent
Kulshreshtha et al.

(10) Patent No.: US 9,390,910 B2
(45) Date of Patent: Jul. 12, 2016

(54) GAS FLOW PROFILE MODULATED CONTROL OF OVERLAY IN PLASMA CVD FILMS

(71) Applicant: Applied Materials, Inc., Santa Clara, CA (US)

(72) Inventors: Prashant Kumar Kulshreshtha, San Jose, CA (US); Sudha Rathi, San Jose, CA (US); Praket P. Jha, San Jose, CA (US); Saptarshi Basu, San Jose, CA (US); Kwangduk Douglas Lee, Redwood City, CA (US); Martin J. Seamons, San Jose, CA (US); Bok Hoen Kim, San Jose, CA (US); Ganesh Balasubramanian, Sunnyvale, CA (US); Ziqing Duan, Sunnyvale, CA (US); Lei Jing, Santa Clara, CA (US); Mandar B. Pandit, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/549,380

(22) Filed: Nov. 20, 2014

(65) Prior Publication Data

US 2016/0099147 A1   Apr. 7, 2016

Related U.S. Application Data

(60) Provisional application No. 62/059,751, filed on Oct. 3, 2014.

(51) Int. Cl.
  *H01L 21/443*   (2006.01)
  *H01L 21/02*    (2006.01)
  (Continued)

(52) U.S. Cl.
  CPC ........ *H01L 21/02274* (2013.01); *C23C 16/455* (2013.01); *C23C 16/458* (2013.01); *C23C 16/46* (2013.01); *H01L 21/0337* (2013.01); *H01L 22/12* (2013.01)

(58) Field of Classification Search
  CPC .............. H01L 21/02274; H01L 22/12; H01L 21/0337; C23C 16/458; C23C 16/46; C23C 16/455
  See application file for complete search history.

(56) References Cited

U.S. PATENT DOCUMENTS

| | | | |
|---|---|---|---|
| 6,645,884 B1 * | 11/2003 | Yang | .................. C23C 16/4412 438/584 |
| 7,297,376 B1 | 11/2007 | Yim et al. | |

(Continued)

OTHER PUBLICATIONS

Arnold, W.H., "Towards 3 nm overlay and critical dimension uniformity: an integrated error budget for double patterning lithography," Optical Microlithography XXI, Proc. of SPIE, vol. 6924, (2008).G7.
International Search Report and Written Opinion for International Application No. PCT/US2015/048153 dated Dec. 8, 2015.

*Primary Examiner* — Long Pham
(74) *Attorney, Agent, or Firm* — Patterson & Sheridan, LLP

(57) ABSTRACT

Methods for modulating local stress and overlay error of one or more patterning films may include modulating a gas flow profile of gases introduced into a chamber body, flowing gases within the chamber body toward a substrate, rotating the substrate, and unifying a center-to-edge temperature profile of the substrate by controlling the substrate temperature with a dual zone heater. A chamber for depositing a film may include a chamber body comprising one or more processing regions. The chamber body may include a gas distribution assembly having a blocker plate for delivering gases into the one or more processing regions. The blocker plate may have a first region and a second region, and the first region and second region each may have a plurality of holes. The chamber body may have a dual zone heater.

20 Claims, 13 Drawing Sheets

(51) Int. Cl.
*H01L 21/66* (2006.01)
*H01L 21/033* (2006.01)
*C23C 16/458* (2006.01)
*C23C 16/46* (2006.01)
*C23C 16/455* (2006.01)

(56) References Cited

U.S. PATENT DOCUMENTS 7,867,578 B2 1/2011 Padhi et al.
8,222,100 B2 7/2012 Cheng et al.
2012/0146159 A1 6/2012 Wang et al.

* cited by examiner

GAS FLOW PROFILE MODULATED CONTROL OF OVERLAY IN PLASMA CVD FILMS

CROSS-REFERENCE TO RELATED APPLICATIONS

This application claims benefit of U.S. Provisional Patent Application No. 62/059,751, filed Oct. 3, 2014, which is incorporated by reference in its entirety.

BACKGROUND

1. Field

Embodiments of the present disclosure generally relate to methods and apparatus for depositing film layers on a substrate.

2. Description of the Related Art

A hardmask, such as amorphous hydrogenated carbon, prevents damage and deformation of delicate materials, such as silicon dioxide or carbon doped silicon oxide. In addition, a hardmask layer may act as an etch mask in conjunction with conventional lithographic techniques to prevent the removal of a material during etching.

A hardmask that is highly transparent to optical radiation, i.e., light wavelengths between about 400 nm and about 700 nm, is desirable in some applications, such as lithographic processing. Transparency to a particular wavelength of light allows for more accurate lithographic registration, which in turn allows for precise alignment of a mask with specific locations on substrate. The transparency of a material to a given frequency of light is generally quantified as the extinction coefficient of a material, also referred to as the absorption coefficient ($\kappa$). For example, for an amorphous hydrogenated carbon layer that is approximately 6000 Å to 7000 Å thick, the amorphous hydrogenated carbon layer should have an absorption coefficient of 0.12 or less at the frequency of light used for the lithographic registration, for example 630 nm, otherwise the mask may not be aligned accurately. A layer with absorption coefficient greater than 0.12 may also be used, but layer thickness may have to be reduced to achieve accurate lithographic registration. Regarding overlay error, high $\kappa$ values do not result in overlay error, but high $\kappa$ range may result in overlay error.

Amorphous hydrogenated carbon, also referred to as amorphous carbon and denoted $\alpha$-C:H, is essentially a carbon material with no long-range crystalline order which may contain a substantial hydrogen content, for example on the order of about 10 to 45 atomic %. The $\alpha$-C:H is used as a hardmask material in semiconductor applications because of its chemical inertness, optical transparency, and good mechanical properties. While $\alpha$-C:H films can be deposited via various techniques, plasma enhanced chemical vapor deposition (PECVD) may be used due to cost efficiency and film property tunability. In a typical PECVD process, plasma is initiated in a chamber to create, for example, excited CH— radicals. The excited CH— radicals are chemically bound to the surface of a substrate positioned in the chamber, forming the $\alpha$-C:H film thereon.

Between one layer and the next layer that overlays the previous one, the individual patterns of the one layer and the next layer should be aligned. A measurement of alignment marks may be obtained by a metrology tool which is then used by a lithography tool to align the subsequent layers during exposure and again after a lithography process to recheck a performance of the alignment. However, overlay errors between layers are inevitable, and error budgets are calculated by integrated circuit designers for which manufacturing must meet. Overlay error budget is defined as errors induced by lithographic scanner inaccuracy/misalignment, non-linear process with-in film variations, mask-to-mask variations, and metrology errors. Overlay errors of the device structure may originate from different error sources, such as overlay errors from previous exposure tool, current exposure tool, a matching error between the overlay errors of the previous exposure tool/metrology tool and of the current exposure tool/metrology tool, or substrate film layer deformation caused by film stress.

As device dimensions continue to shrink, next-generation lithography (NGL) processes should have overlay error budget of <6-8 nm within a substrate. During, for example, PECVD processes, local partial pressures, temperature, residence time and/or reactivity of gaseous components may give a non-uniform morphology of the deposited film, wherein, for example, local stress of the film differs in various regions of the film. Such non-uniform morphology results in overlay errors locally at various regions on the film. Furthermore, next generation CVD hardmask films contribute >50% of overlay error, significantly reducing device yield and performance. There is a need in the art to reduce overlay error within deposited multilayers and a need for a method of depositing a material layer useful for integrated circuit fabrication which can be conformally deposited on substrates having topographic features.

SUMMARY

In one embodiment, a method of modulating local stress and overlay error of one or more patterning films comprises modulating a gas flow profile of gases via a blocker plate comprising a first region and a second region, wherein the first region and second region each have a plurality of holes. The method may include introducing the gases into a chamber body through the pluralities of holes of the first and second regions of the blocker plate. The method may include flowing gases within the chamber body toward a first region and a second region of a substrate. The method may include rotating the substrate after deposition of at least a partial film onto the substrate.

In another embodiment, a method of modulating local stress and overlay error of one or more patterning films comprises modulating a gas flow profile of gases via a blocker plate comprising a first region and a second region, wherein the first region and second region each have a plurality of holes. The method may include introducing the gases into a chamber body through the pluralities of holes of the first and second regions of the blocker plate. The method may include flowing gases within the chamber body toward a first region and a second region of a substrate. The method may include unifying a center-to-edge temperature profile of the substrate by controlling the substrate temperature with a dual zone heater, wherein the dual zone heater comprises a first heating zone and a second heating zone, wherein the second heating zone circumscribes the first heating zone.

In another embodiment, a chamber for depositing a film comprises a chamber body comprising one or more processing regions. The chamber body may comprise a gas distribution assembly comprising a blocker plate for delivering gases into the one or more processing regions, wherein the blocker plate comprises a first region and a second region, wherein the first region and second region each comprises a plurality of holes. The chamber body may comprise a dual zone heater, wherein the dual zone heater comprises a first heating zone and a second heating zone, wherein the second heating zone circumscribes the first heating zone, and wherein one of the heating zones is about 5 mm to about 200 mm from a center axis of the dual zone heater. The chamber body may comprise a shadow ring configured to support a substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
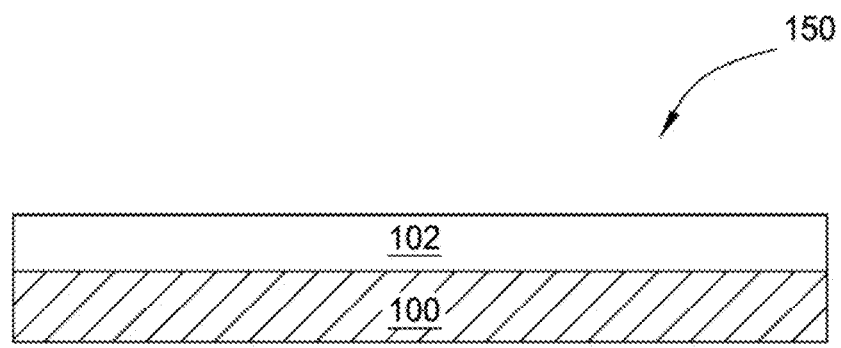
FIGS. 1A-1B each illustrate a schematic cross-sectional view of a substrate at different stages of an integrated circuit fabrication sequence incorporating an amorphous carbon layer as a hardmask.
Figure 1B:
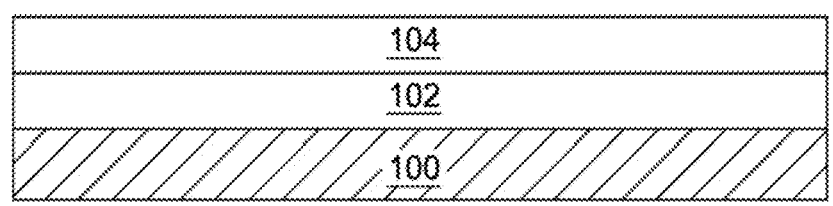

FIGS. 1A-1B illustrate schematic cross-sectional views of a substrate 100 at different stages of an integrated circuit fabrication sequence incorporating an amorphous carbon-hydrogen (α-C:H) layer as a hardmask. A substrate structure 150 denotes the substrate 100 together with other material layers formed on the substrate 100. FIG. 1A illustrates a cross-sectional view of a substrate structure 150 having a material layer 102 that has been conventionally formed thereon. The material layer 102 may be a low-k material such as an oxide having pores, e.g., $SiO_2$, $Si3N4$, oxides, nitrides, or a carbon-doped silicon oxide.

FIG. 1B illustrates an amorphous carbon layer 104 deposited on the substrate structure 150 of FIG. 1A. The amorphous carbon layer 104 is formed on the substrate structure 150 by conventional means, such as PECVD. The thickness of amorphous carbon layer 104 is variable depending on the specific stage of processing. Typically, amorphous carbon layer 104 has a thickness in the range of about 500 Å to about 10,000 Å.

Aspects of the present disclosure contemplate the use of a relatively large flow rate of argon or other heavy noble gas, such as krypton or xenon, as a diluent gas during α-C:H film deposition to increase the resultant film density (and therefore etch selectivity), the deposition rate of the film, and the conformality of the film to features on the surface of the substrate. The application of a heavy noble gas as a large flow rate diluent gas also improves the efficiency of hydrocarbon precursor utilization during the deposition process, minimizing unwanted deposition on interior surfaces of the deposition chamber. Helium has been used as the primary non-reactive component of the working gas in a PECVD chamber for α-C:H film deposition since it is easily ionized and is therefore advantageous for initiating plasma in a chamber with a low risk of arcing.

Figure 3:
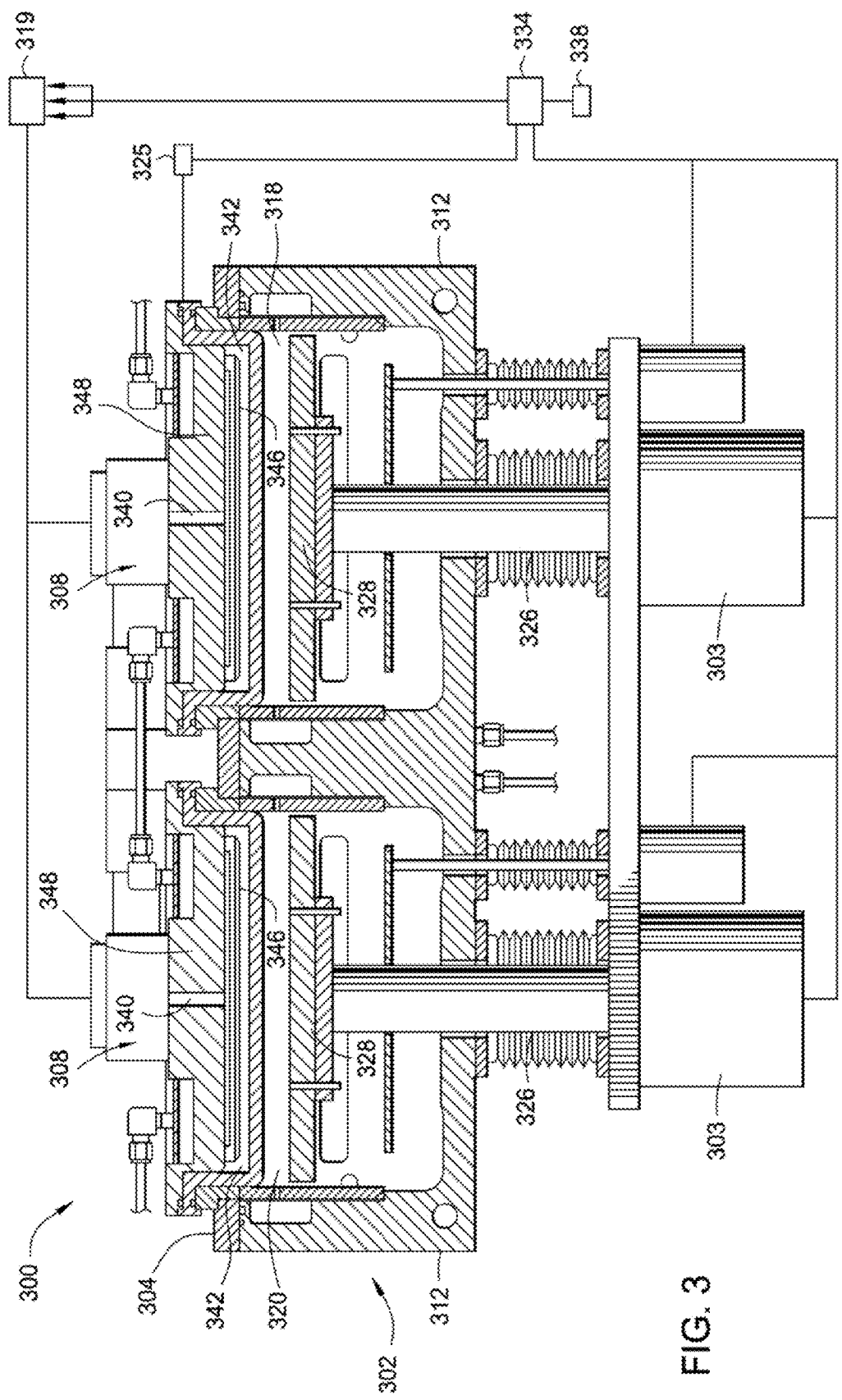
FIG. 3 is a schematic cross-sectional diagram of an exemplary processing chamber that may be used for practicing some embodiments of the present disclosure.

FIG. 3 presents a cross-sectional, schematic diagram of a chemical vapor deposition (CVD) chamber 300 for depositing an advanced patterning film such as an amorphous carbon layer. One example of the chamber 300 may be, for example, a PRODUCER® chamber or XP PRECISION™ chamber manufactured by Applied Materials, Inc., Santa Clara, Calif. The PRODUCER® CVD chamber (200 mm or 300 mm) has two isolated processing regions that may be used to deposit carbon-doped silicon oxides and other materials.

The deposition chamber 300 has a chamber body 302 that defines separate processing regions 318, 320. Each processing region 318, 320 has a pedestal 328 for supporting a substrate (not shown) within the chamber 300. The pedestal 328 typically includes a heating element (not shown). The pedestal 328 may be movably disposed in each processing region 318, 320 by a stem 326 which extends through the bottom of the chamber body 302 where it is connected to a drive system 303. Internally movable lift pins (not shown) may be provided in the pedestal 328 to engage a lower surface of the substrate. The lift pins may be engaged by a lift mechanism (not shown) to receive a substrate before processing, or to lift the substrate after deposition for transfer to the next station.

Each of the processing regions 318, 320 may also include a gas distribution assembly 308 disposed through a chamber lid 304 to deliver gases into the processing regions 318, 320. The gas distribution assembly 308 of each processing region normally includes a gas inlet passage 340 through manifold 348 which delivers gas from a gas distribution manifold 319 through a blocker plate 346 and then through a showerhead 342. The showerhead 342 includes a plurality of holes (not shown) through which gaseous mixtures are injected during processing. An RF (radio frequency) supply 325 provides a bias potential to the showerhead 342 to facilitate generation of a plasma between the showerhead and the pedestal 328. During a plasma-enhanced chemical vapor deposition process, the pedestal 328 may serve as a cathode for generating the RF bias within the chamber body 302. The cathode is electrically coupled to an electrode power supply to generate a capacitive electric field in the deposition chamber 300. Typically an RF voltage is applied to the cathode while the chamber body 302 is electrically grounded. Power applied to the pedestal 328 creates a substrate bias in the form of a negative voltage on the upper surface of the substrate. This negative voltage is used to attract ions from the plasma formed in the chamber 300 to the upper surface of the substrate. The capacitive electric field forms a bias which accelerates inductively formed plasma species toward the substrate to provide a more vertically oriented anisotropic filming of the substrate during deposition, and etching of the substrate during cleaning.

During processing, process gases may be uniformly distributed radially across the substrate surface. The plasma is formed from one or more process gases or a gas mixture by applying RF energy from the RF power supply 325 to the showerhead 342, which acts as a powered electrode. Film deposition takes place when the substrate is exposed to the plasma and the reactive gases provided therein. The chamber walls 312 are typically grounded. The RF power supply 325 can supply either a single or mixed-frequency RF signal to the showerhead 342 to enhance the decomposition of any gases introduced into the processing regions 318, 320.

In some embodiments, process gases are distributed radially "more flow-at-center" or "more flow-at-edge" across the substrate surface depending on, for example, the configuration of blocker plate 346, as described in more detail below.

A system controller 334 controls the functions of various components such as the RF power supply 325, the drive system 303, the lift mechanism, the gas distribution manifold 319, and other associated chamber and/or processing functions. The system controller 334 executes system control software stored in a memory 338, which may be a hard disk drive, and can include analog and digital input/output boards, interface boards, and stepper motor controller boards. Optical and/or magnetic sensors are generally used to move and determine the position of movable mechanical assemblies.

The above CVD system description is mainly for illustrative purposes, and other plasma processing chambers may also be employed for practicing embodiments of the present disclosure.

A wide variety of process gas mixtures may be used in the deposition process. The process gas may be introduced into the processing chamber at a flow rate in a range of between about 10 mg/min. and about 5,000 mg/min., such as between about 300 mg/min. and about 3,000 mg/min.

The gas mixture optionally includes one or more carrier gases. Examples of carrier gases that may be used include helium, argon, carbon dioxide, and combinations thereof. The one or more carrier gases may be introduced into the processing chamber at a flow rate less than about 20,000 standard cubic centimeter per minute (sccm), depending in part upon the size of the interior of the chamber. The flow of carrier gas may be in a range of about 500 sccm to about 1,500 sccm, about 1,000 sccm. In some processes, an inert gas such as helium or argon is put into the processing chamber to stabilize the pressure in the chamber before reactive process gases are introduced.

The gas mixture may include one or more oxidizing gases. Suitable oxidizing gases include oxygen ($O_2$), ozone ($O_3$), nitrous oxide ($N_2O$), carbon monoxide (CO), carbon dioxide ($CO_2$), and combinations thereof. The flow of oxidizing gas may be in a range of about 100 sccm to about 3,000 sccm, depending in part upon the size of the interior of the chamber. Typically, the flow of oxidizing gas is in a range of about 100 sccm to about 1,000 sccm. Disassociation of oxygen or the oxygen containing compounds may occur in a microwave chamber prior to entering the deposition chamber and/or by RF power as applied to process gas within the chamber.

During deposition, a controlled plasma is typically formed in the chamber adjacent to the substrate by RF energy applied to the showerhead using an RF power supply 325 as depicted in FIG. 3. Alternatively, RF power may be provided to the substrate support. The plasma may be generated using high frequency RF (HFRF) power, as well as low frequency RF (LFRF) power (e.g., dual frequency RF), constant RF, pulsed RF, or any other plasma generation technique. The RF power supply 325 can supply a single frequency RF between about 5 MHz and about 300 MHz. In addition, the RF power supply 325 may also supply a single frequency LFRF between about 300 Hz to about 1,000 kHz to supply a mixed frequency to enhance the decomposition of reactive species of the process gas introduced into the process chamber. The RF power may be cycled or pulsed to reduce heating of the substrate and promote greater porosity in the deposited film. Suitable RF power may be a power in a range of about 10 W to about 5,000 W, about 200 W to about 1000 W. Suitable LFRF power may be a power in a range of about 0 W to about 5,000 W, about 0 W to about 200 W.

Deposition Process:

Aspects of the present disclosure contemplate the deposition of an α-C:H layer by a process that includes introducing a hydrocarbon source, a plasma-initiating gas, and a diluent gas into a processing chamber. The hydrocarbon source is a mixture of one or more hydrocarbon compounds. The hydrocarbon source may include a gas-phase hydrocarbon compound, such as $C_3H_6$, and/or a gas mixture including vapors of a liquid-phase hydrocarbon compound and a carrier gas. The plasma-initiating gas may be helium, because it is readily ionized, however other gases, such as argon, may also be used. The diluent gas is an easily ionized, relatively massive, and chemically inert gas. Exemplary diluent gases include argon, krypton, and xenon.

Additionally, amorphous carbon layers formed using partially or completely doped derivatives of hydrocarbon compounds may also benefit from method of the present disclosure. Derivatives include nitrogen-containing, fluorine-containing, oxygen-containing, hydroxyl group-containing, and boron-containing derivatives of hydrocarbon compounds. The hydrocarbon compounds may be functionalized with nitrogen-containing substituents and/or be deposited with a nitrogen-containing gas, such as ammonia. The hydrocarbon compounds may be functionalized with fluorine-containing and/or oxygen-containing substituents.

The α-C:H deposition process with argon dilution may be a PECVD process. The α-C:H layer may be deposited from the processing gas by maintaining a substrate temperature between about 100° C. and about 650° C. in order to minimize the absorption coefficient range of the resultant film. The process further includes maintaining a chamber pressure between about 0.4 Torr and about 10 Torr. The deposition rate may be between about 2,000 Å/min. and about 20,000 Å/min. The hydrocarbon source, a plasma-initiating gas, and a diluent gas may be introduced into the chamber and plasma is initiated to begin deposition. The plasma-initiating gas may be helium or another easily ionized gas and is introduced into the chamber before the hydrocarbon source and the diluent gas, which allows a stable plasma to be formed and reduces the chances of arcing. Plasma is generated by applying RF power at a power density to substrate surface area of between about 0.7 W/cm$^2$ and about 3 W/cm$^2$, such as between about 1.1 to 2.3 W/cm$^2$. Electrode spacing, e.g., the distance between the substrate and the showerhead, may be between about 200 mils and about 1000 mils.

A dual-frequency RF system may be used to generate plasma. The dual frequency is believed to provide independent control of flux and ion energy, since the energy of the ions hitting the film surface influences the film density. Without being bound by theory, the high frequency plasma controls plasma density and the low frequency plasma controls kinetic energy of the ions hitting the substrate surface. A dual-frequency source of mixed RF power provides a high frequency power in a range between about 10 MHz and about 30 MHz, for example, about 13.56 MHz, as well as a low frequency power in a range of between about 10 KHz and about 1 MHz, for example, about 350 KHz. When a dual frequency RF system is used to deposit an α-C:H film, the ratio of the second RF power to the total mixed frequency power may be less than about 0.6 to 1.0 (0.6:1). The applied RF power and use of one or more frequencies may be varied based upon the substrate size and the equipment used.

Very high film stress in a deposited α-C:H film causes problems such as poor adhesion of the α-C:H film to substrate surfaces and/or cracking of the α-C:H film. Therefore, the addition of argon or other diluent beyond a certain molar ratio relative to the hydrocarbon compound will deleteriously affect the properties of the film. Hence, there is a process window, wherein the ratio of molar flow rate of argon diluent to the molar flow rate of hydrocarbon compound into the PECVD chamber may be maintained between about 2:1 and about 40:1, depending on the desired properties of the deposited film. For the deposition of some α-C:H films, the range of the ratio of molar flow rate of argon diluent to the molar flow rate of hydrocarbon compound into the PECVD chamber may be between about 10:1 and about 14:1.

Ordinarily, higher substrate temperature during deposition is a process parameter used to encourage the formation of a higher density film. Because the argon-diluted process already increases density for the reasons described above, substrate temperature may be reduced during deposition, for example to as low as about 300° C., and still produce a film of a desired density, e.g., from about 1.2 g/cc to about 2.2 g/cc. Hence, the argon-dilution process may produce a relatively high density film with an absorption coefficient as low as about 0.09. Further, lower processing temperatures are generally desirable for all substrates since this lowers the thermal budget of the process, protecting devices formed thereon from dopant migration.

Figure 2A:
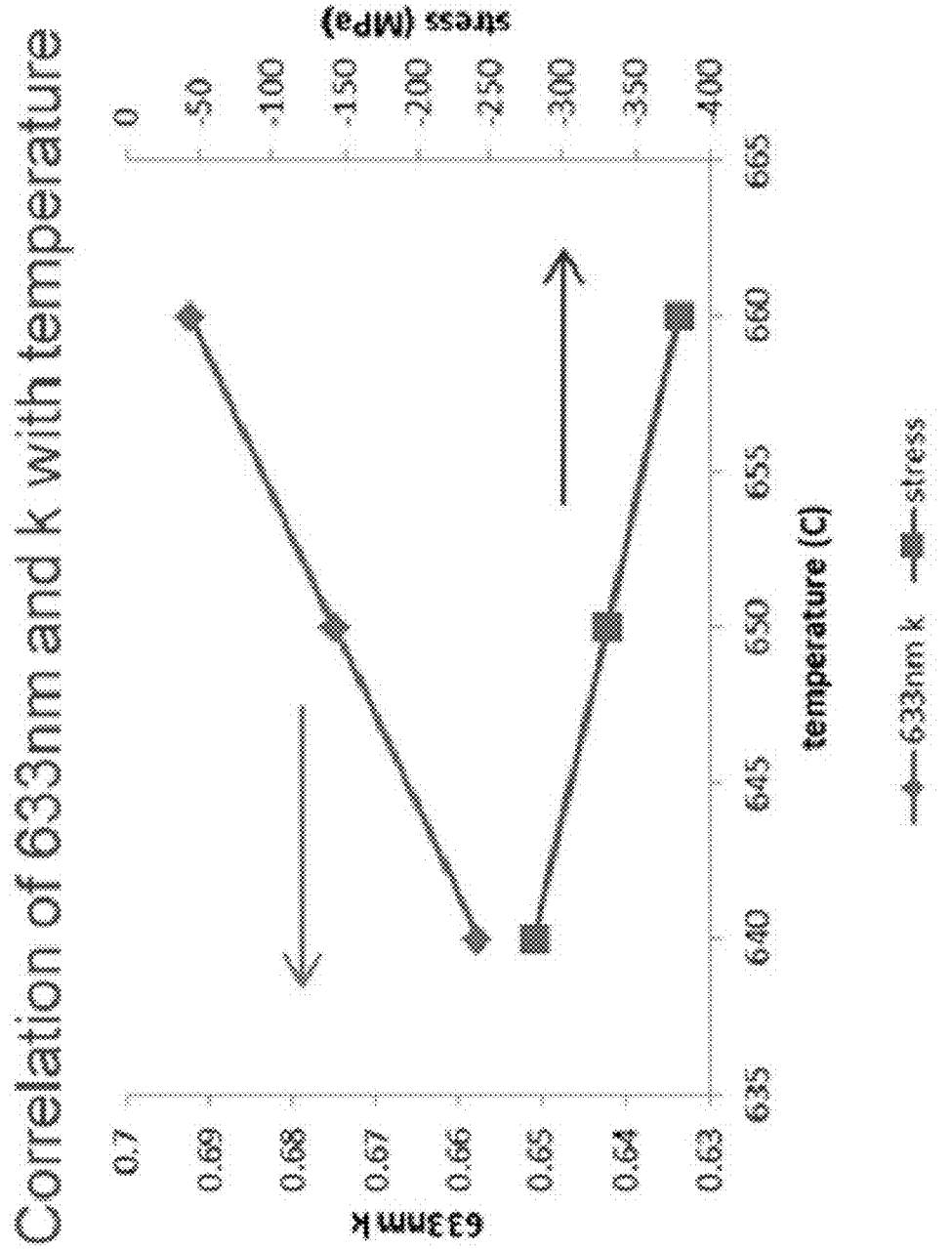
FIG. 2A illustrates gas flow morphology with respect to κ-range and local stress.

Process-induced overlay error relates to local curvature and bow of a deposited film, which can be measured as local stress variations within a film. Film stress increases overlay error because a variation of $sp^2/sp^3$ binding affects the structural uniformity across the film, e.g. a hardmask. For example, when temperature distribution across a surface is profiled using a thermocouple, the center of the substrate may have a higher temperature than the edge of the substrate, resulting in the higher temperature region of the substrate comprising more $sp^2$ character than lower temperature regions of the substrate. Furthermore, absorption coefficient (κ) strongly depends on film morphology and molecular structure (i.e., a film region with more $sp^2$ character absorbs light more efficiently than a film region with less $sp^2$ character). As such, the absorption coefficient may be monitored, e.g. at 633 nm, to determine film morphology across a substrate, as shown in FIG. 2A, using various metrology tools. Metrology tools refer to an interferometric based tool which may be utilized to determine a local stress map, for example, from KLA Tencor's Aleris series. However, it is contemplated that other tools from other manufacturers suitably adapted to perform stress measurement processes may also be utilized.

By monitoring film morphology across a substrate, deposition parameters of a deposition process and/or hardware of a deposition chamber may be varied to deposit one or more films, wherein each of the one or more films comprises a uniform morphology and reduced overlay error.

Figure 4:
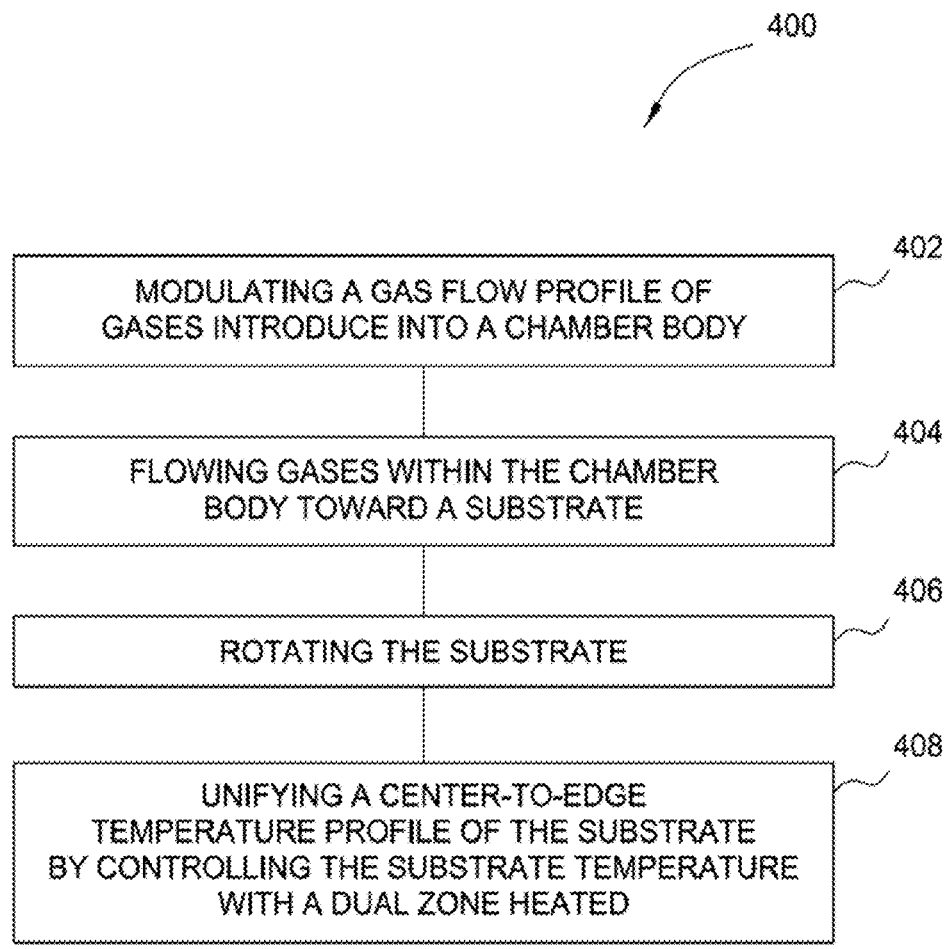
FIG. 4 is a process flow diagram illustrating a method according to some embodiments of the present disclosure.

FIG. 4 is a process flow diagram illustrating a first method according to some embodiments of the present disclosure. As shown in FIG. 4, local stress and overlay error of one or more patterning films may be modulated by modulating a gas flow profile of gases introduced into a chamber body (block 402).

Figure 5A:
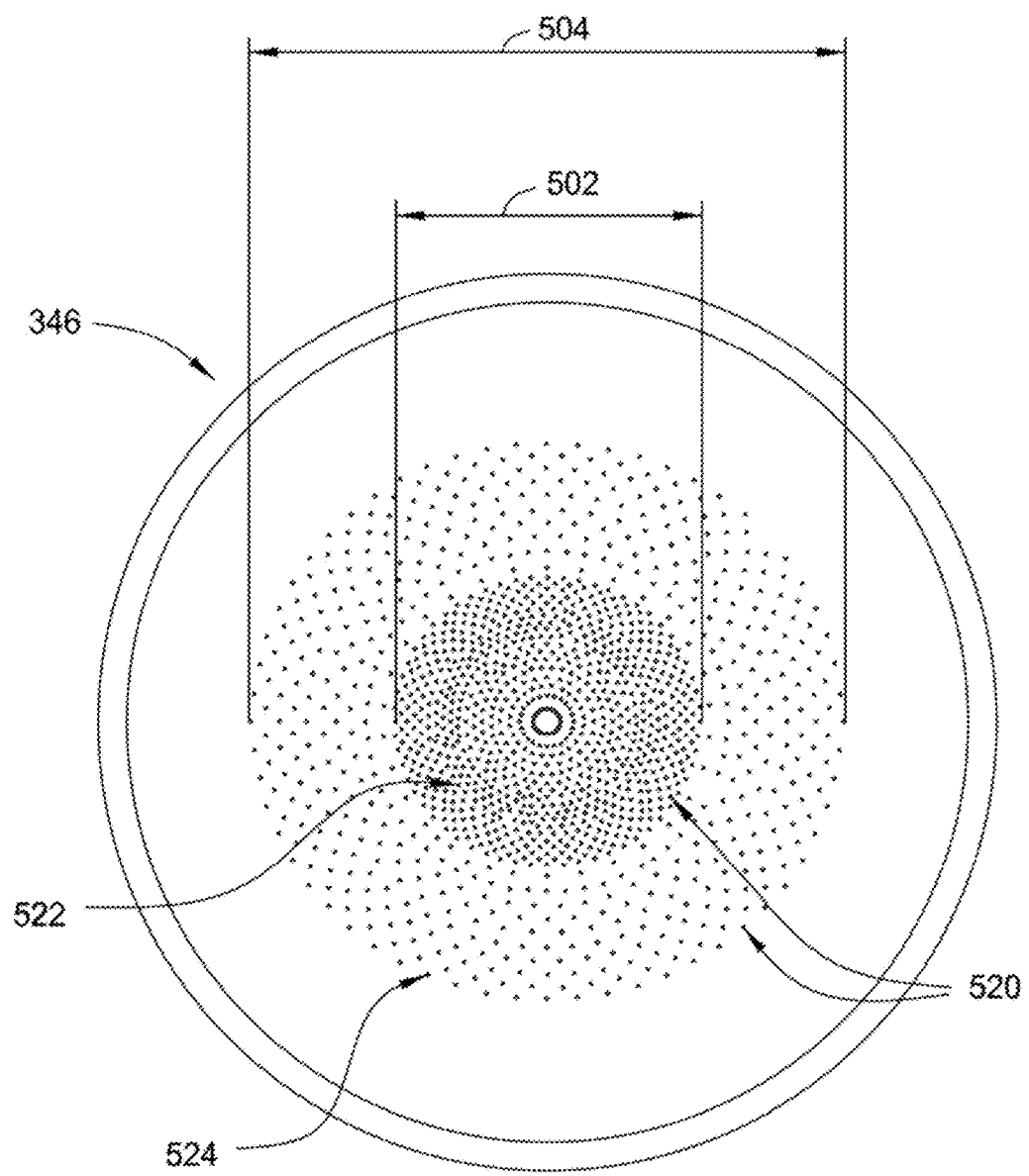
FIGS. 5A-5C illustrates bottom views of a blocker plate according to some embodiments of the present disclosure.

The gases may then be flowed within the chamber body toward a substrate (block 404). A gas flow profile may be modulated, for example, by altering the density of holes of blocker plate 346. Density of holes refers to the spacing between each of the holes in a particular region of blocker plate 346. FIG. 5A is a bottom view of the blocker plate 346. As shown in FIG. 5A, the inner region 522 is circular in shape and has a greater density of holes 520 relative to the density of holes 520 of the outer region 524. A diameter 502 of the inner region 522 corresponds to the inner diameter of a corresponding showerhead 342. The outer region 524 is annular, or ring-like, in shape and surrounds the inner region 522. An outer diameter 504 of the outer region 524 corresponds to partially or substantially the outer diameter of showerhead 342.

The holes 520 in the inner region 522 are more closely spaced from one another relative to the spacing of the holes 520 in the outer region 524. Thus, the density of holes 520 in the outer region 524 is less than the density of holes 520 in the inner region 522. Thus, gas flow through the blocker plate 346 will be greater at inner region 522 than gas flow through outer region 524 because of the larger density of holes 520 of the inner region 522 than density of holes 520 of the outer region 524. In other words, there may be more gas flow toward the center of showerhead 342 than toward the edge of showerhead 342.

Figure 5B:
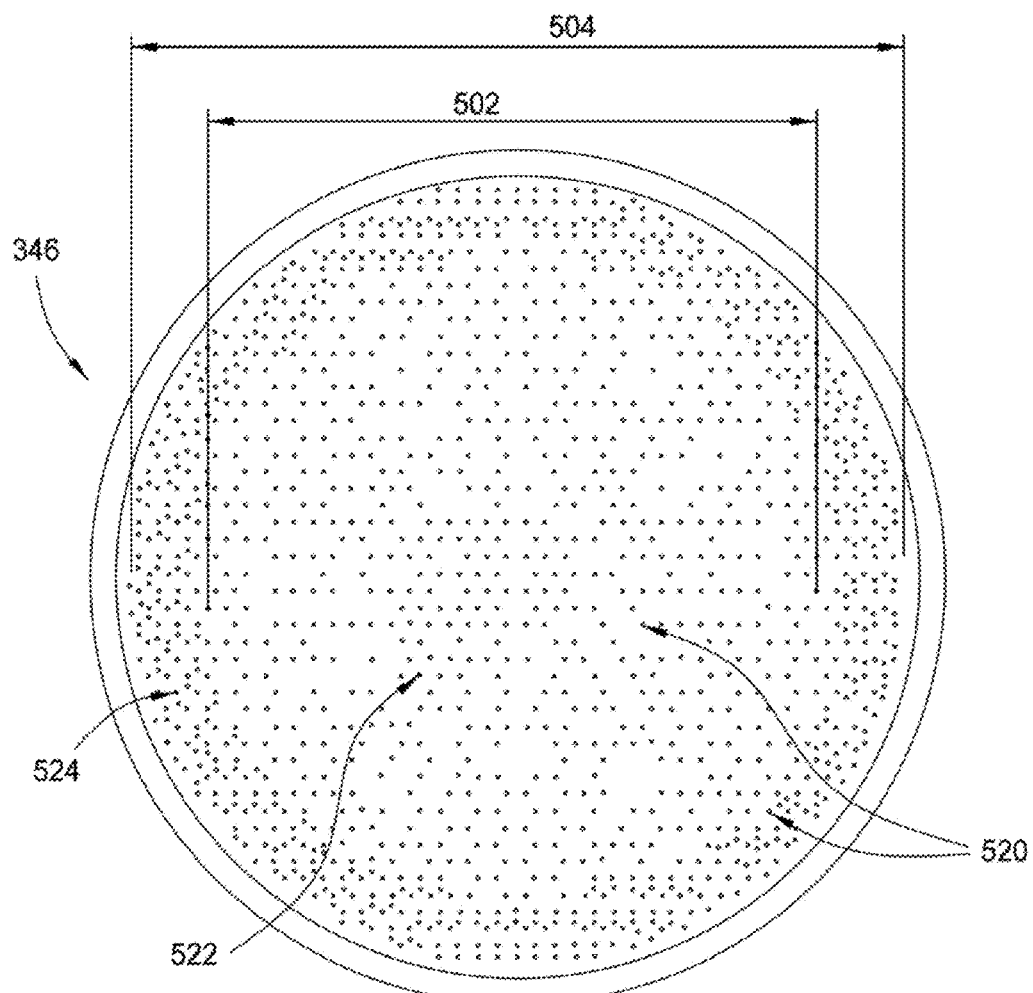

FIG. 5B is a bottom view of an alternate embodiment of blocker plate 346. As shown in FIG. 5B, the holes 520 in the outer region 524 are more closely spaced from one another relative to the spacing of the holes 520 in the inner region 522. Thus, the density of holes 520 of outer region 524 may be greater than the density of holes 520 of the inner region 522. Thus, gas flow through the blocker plate 346 will be greater at outer region 524 than gas flow at inner region 522 because of the larger density of holes 520 in the outer region 524 than density of holes 520 of the inner region 522. In other words, there may be more gas flow at the edge of showerhead 342 than at the center of showerhead 342.

Figure 5C:
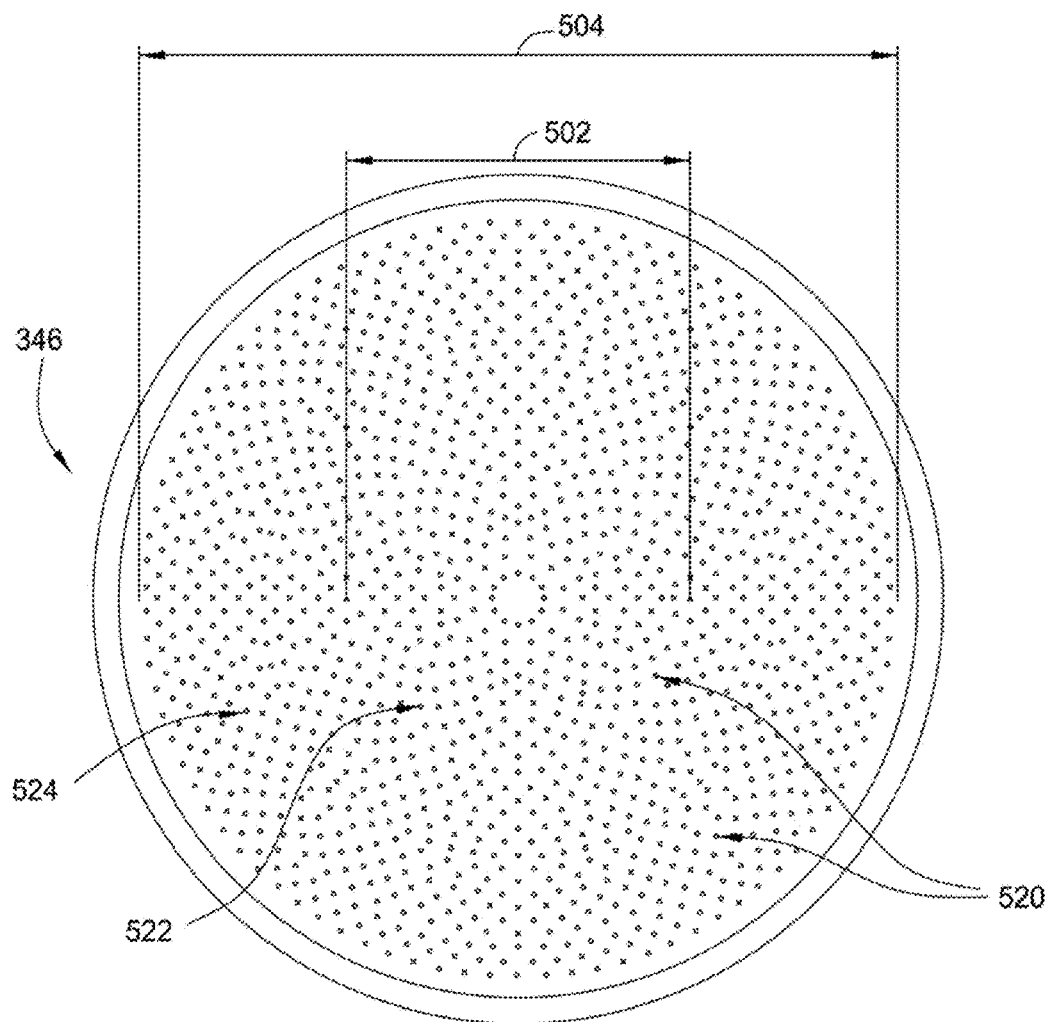

FIG. 5C is a bottom view of an alternate embodiment of blocker plate 346. As shown in FIG. 5C, the holes 520 in the outer region 524 are spaced from one another substantially similar to the spacing of the holes 520 in the inner region 522. Thus, the density of holes 520 of outer region 524 is substantially similar to the density of holes 520 of the inner region 522. Thus, gas flow through the blocker plate 346 at outer region 524 and inner region 522 will be substantially uniform because the density of holes 520 in the outer region 524 and the inner region 522 is substantially uniform. In other words, there may be a substantially uniform gas flow across the entire substrate.

In some embodiments, the surface area of inner region 522 may be substantially similar to the surface area of outer region 524 or, alternatively, may be different than the surface area of outer region 524, depending on the amount of desired gas flow toward the center and/or edge of a substrate. Furthermore, blocker plate 346 may comprise additional regions (not shown) of varying density of holes 520.

Figure 6:
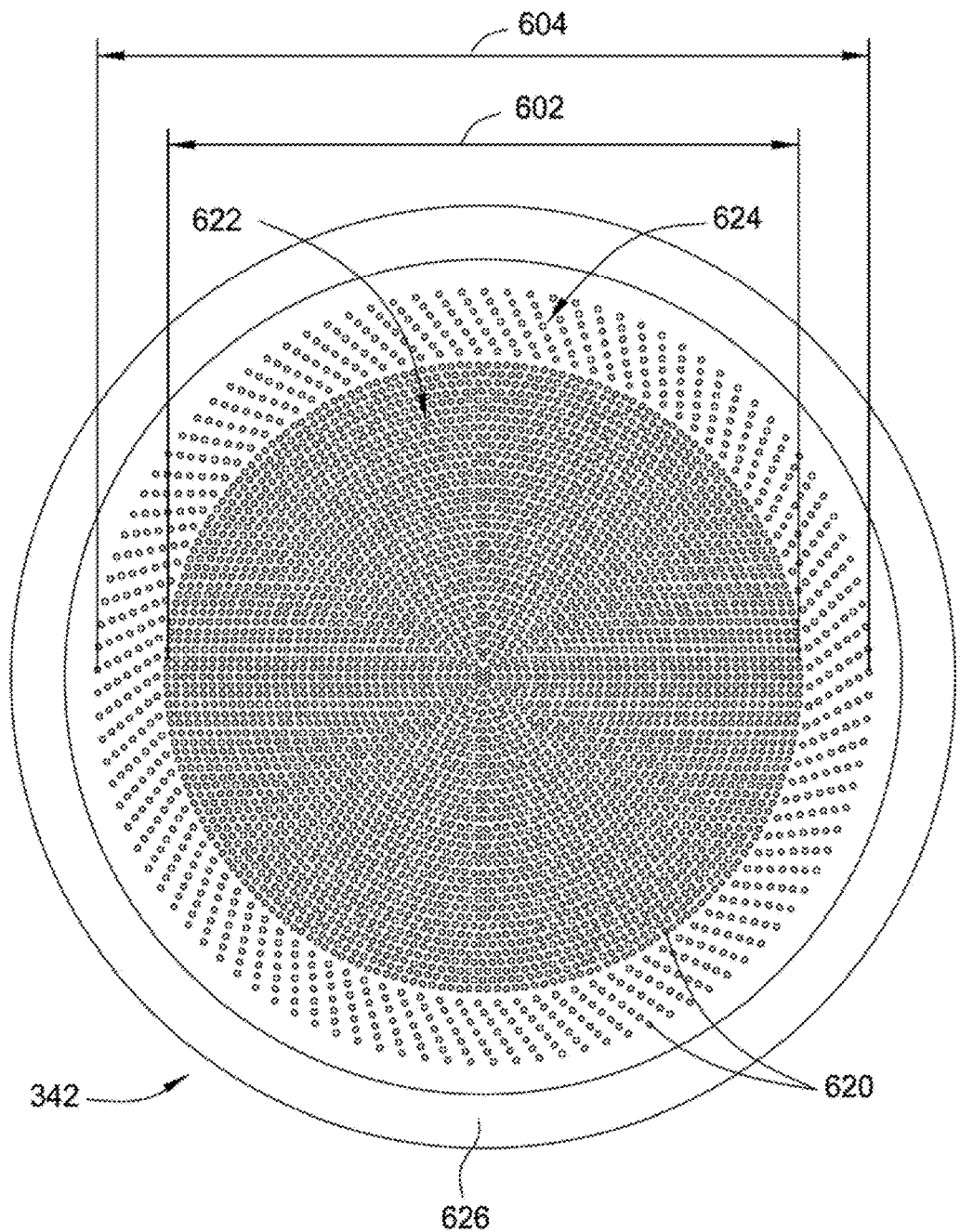
FIG. 6 is a bottom view of a showerhead according to some embodiments of the present disclosure.

Alternatively, or in addition to blocker plate 346, the showerhead 342 may be configured to adjust a gas flow profile. FIG. 6 is a bottom view of the showerhead 342. As shown in FIG. 6, the inner region 622 is circular in shape and has a greater density of holes 620 relative to the density of holes 620 of the outer region 624. A diameter 602 of the inner region 622 corresponds to the inner diameter of a corresponding substrate. The outer region 624 is annular, or ring-like, in shape and surrounds the inner region 622. An outer diameter 604 of the outer region 624 corresponds to substantially the outer diameter of a substrate.

The showerhead 342 is disposed within the processing volume 318, 320 and coupled to the chamber body 302. A ledge 626, or other similar structure, of the showerhead 326 is configured to mate with a support within the chamber body 302, such as blocker plate 346. The blocker plate 346 spaces the showerhead 342 from the chamber body 302 and positions the showerhead 342 within the processing volume 318. The showerhead 342 and blocker plate 346 may be fastened together by a bolt or screw, or other similar fastening apparatus.

The holes 620 in the inner region 622 are more closely spaced from one another relative to the spacing of the holes 620 in the outer region 624. Thus, the density of holes 620 in the outer region 624 is less than the density of holes 620 in the inner region 622. In such embodiments, gas flow through the showerhead 342 will be greater at inner region 622 than gas flow through outer region 624 because of the larger density of holes 620 of the inner region 622 than density of holes 620 of the outer region 624. In other words, there may be more gas flow toward the center of the substrate than toward the edge of the substrate.

Alternatively, the holes 620 in the outer region 624 may be more closely spaced from one another relative to the spacing of the holes 620 in the inner region 622. Thus, the density of holes 620 of outer region 624 may be greater than the density of holes 620 of the inner region 622. Thus, gas flow through the showerhead 342 will be greater at outer region 624 than gas flow at inner region 622 because of the larger density of holes 620 in the outer region 624 than density of holes 620 of the inner region 622. In other words, there may be more gas flow at the edge of the substrate than at the center of the substrate.

Alternatively, the holes 620 in the outer region 624 may be spaced from one another substantially similar to the spacing of the holes 620 in the inner region 622. Thus, the density of holes 620 of outer region 624 is substantially similar to the density of holes 620 of the inner region 622. Thus, gas flow through the showerhead 342 at outer region 624 and inner region 622 will be substantially uniform because the density of holes 620 in the outer region 624 and the inner region 622 is substantially uniform. In other words, there may be a substantially uniform gas flow across the entire substrate.

In some embodiments, the surface area of inner region 622 may be substantially similar to the surface area of outer region 624 or, alternatively, may be different from the surface area of outer region 624 depending on the amount of desired gas flow toward the center and/or edge of a substrate. Furthermore, showerhead 342 may comprise additional regions (not shown) of varying density of holes 620.

Figures 2B, 2C:
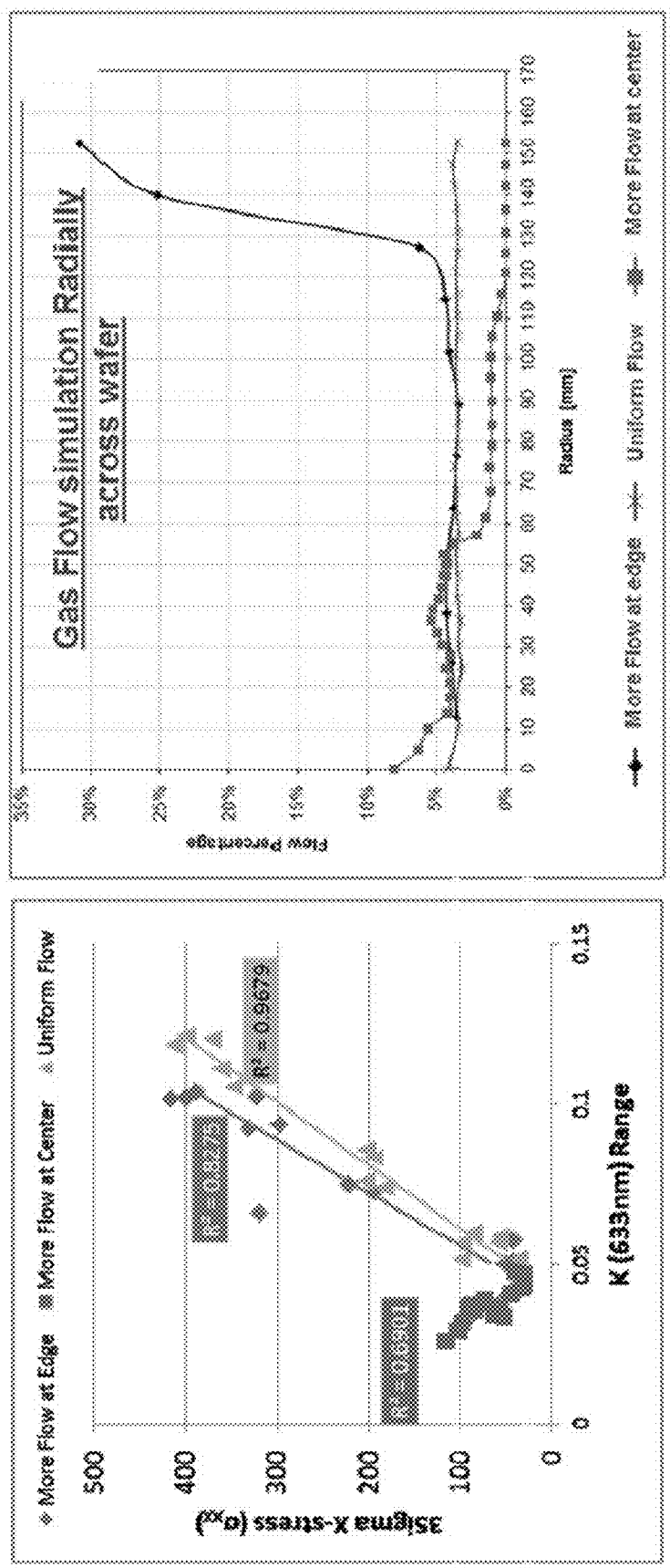
FIGS. 2B-2C illustrate radial gas flow with respect to κ-range and local stress.

FIGS. 2B-2C illustrate radial gas flow with respect to κ-range and local stress. As shown in FIGS. 2B-2C, for uniform flow across a substrate, lower κ-range reduces process-induced local stress variation and overlay error. However, this trend is reversed with "more flow-at-center" deposition where a lower κ-range does not improve overlay due to increase in substrate-scale stress. Nonetheless, "more flow-at-center" allows significant reduction (>50%) in overall κ-range and stress compared to "uniform flow" and "more flow-at-edge" conditions. Thus, gas profile modulation provides an optimum point of κ-range where control in overlay error and local stress variation can be achieved.

Figure 7:
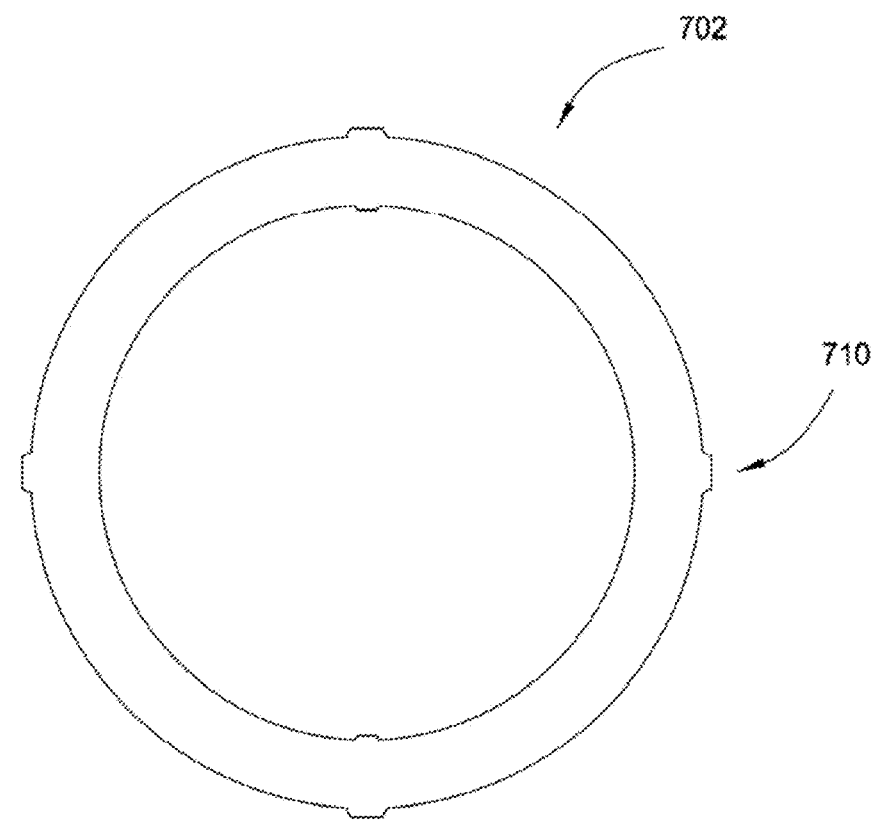
FIG. 7 is a plan view of a shadow ring according to some embodiments of the present disclosure.

In some embodiments, κ-range and local stress may be improved by substrate rotation, corresponding to block 406 of FIG. 4. FIG. 7 is a plan view of a shadow ring 702 for supporting a substrate according to some embodiments of the present disclosure. As shown in FIG. 7, the shadow ring 702 may comprise one or more notches 710 which may be used to facilitate angles of rotation of the substrate. Optionally, an ex-situ rotation may be performed. An ex-situ rotation may be performed wherein the substrate may be removed from chamber body 302, rotated and reentered into chamber body 302 for further processing. For example, a robot blade (not shown) may enter the chamber through a slit valve disposed through a wall of the chamber, wherein the robot arm then engages a bottom surface of the substrate that is being supported by lift pins. The robot blade may remove the substrate from the chamber. The substrate may be rotated in a clockwise or counterclockwise direction between about 15 degrees to about 345 degrees, about 150 degrees to about 250 degrees, about 180 degrees. In some embodiments, the substrate comprises one or more notches (not shown) to facilitate substrate rotation. After rotation, the substrate may be reentered into the chamber for further processing.

An ex-situ rotation may be performed in-between deposition of film layers. Alternatively, ex-situ rotation may be performed by interrupting the deposition of a film layer, followed by removal of the substrate from chamber body 302, even without the risk of native layer formation. The substrate may then be rotated and reentered into chamber body 302. Deposition of the film layer may then resume within chamber body 302.

Figure 2D:
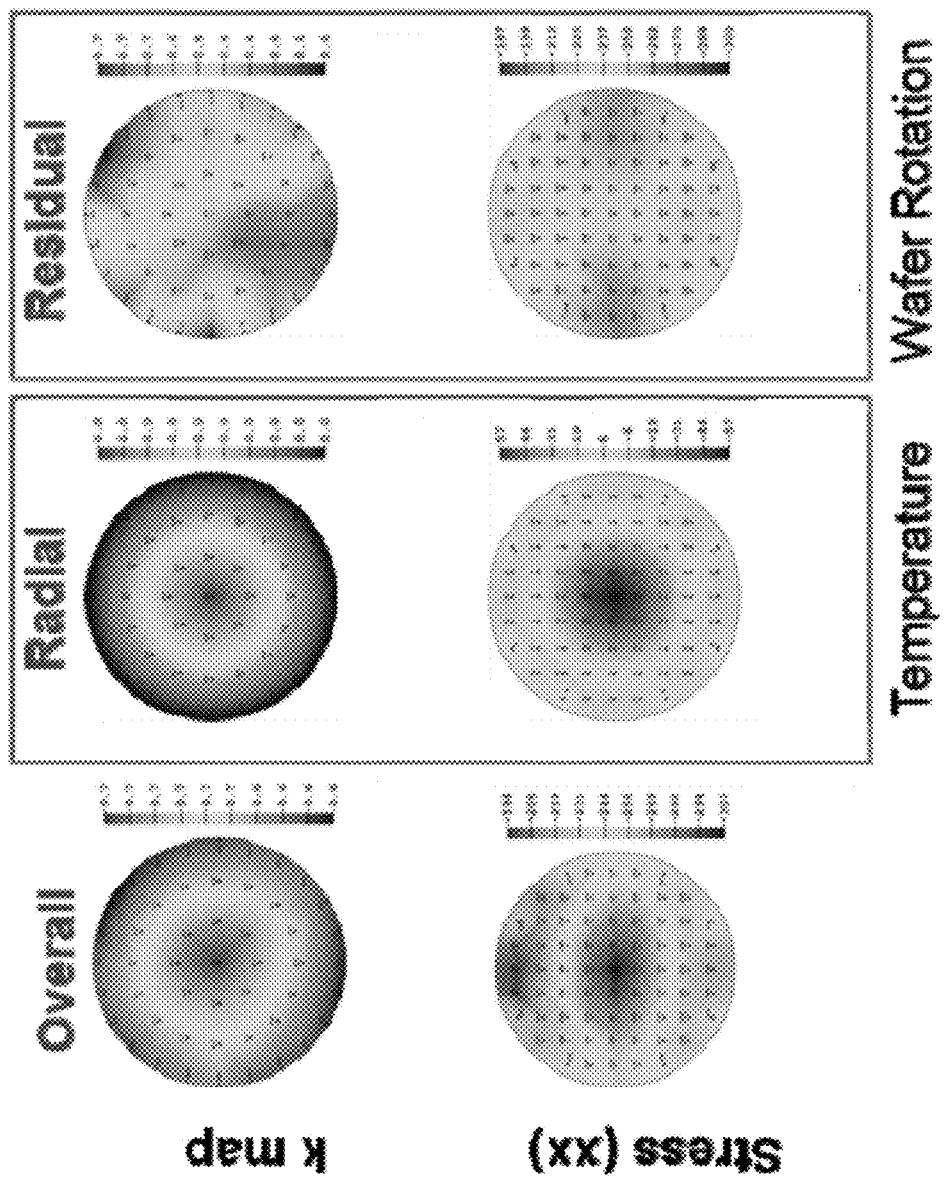
FIG. 2D illustrates radial and azimuthal components of κ-633 nm and local stress.
Figure 2E:
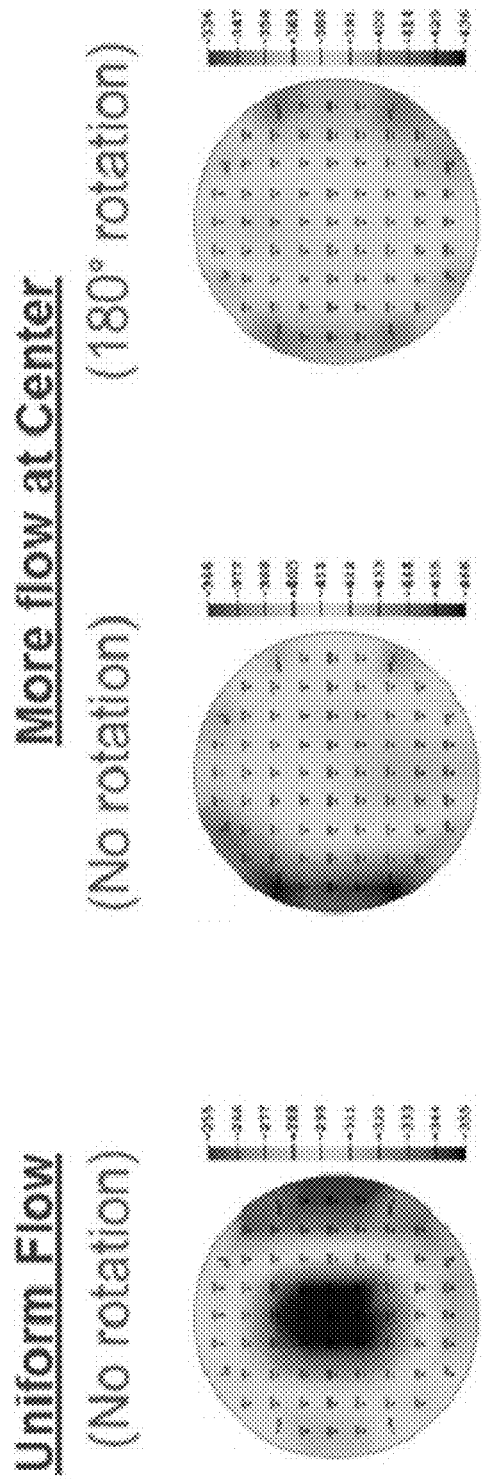
FIG. 2E illustrates the effect of "more flow-at-center" in combination with substrate rotation on local stress and overlay error.

FIG. 2D illustrates radial (i.e., controlled by flow profile and temperature offsets) and azimuthal (i.e., controlled by substrate rotation) components of κ-633 nm and local stress (denoted $\sigma_{xx}$). As shown in FIG. 2D, substrate rotation reduces local stress and κ-range within a deposited film. Substrate rotation may also improve thickness uniformity of a deposited film by normalizing thickness variation introduced by, for example, hardware features. FIG. 2E illustrates the effect of "more flow-at-center" in combination with substrate rotation on local stress and overlay error. As shown in FIG. 2E, a 50% reduction in stress ($\sigma_{xx}$) may be obtained with "more flow-at-center" compared to uniform flow. 180° ex-situ rotation at half film thickness further reduces stress ($\sigma_{xx}$) by greater than 75%, and an overlay error of about 6 nm to about 8 nm may be obtained.

Figure 2F:
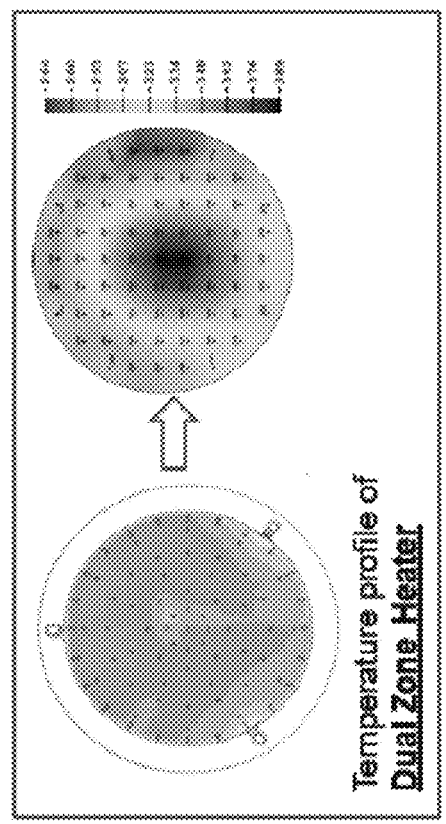
FIG. 2F illustrates the temperature profiles of a single zone heater and dual zone heater.
Figure 2F:
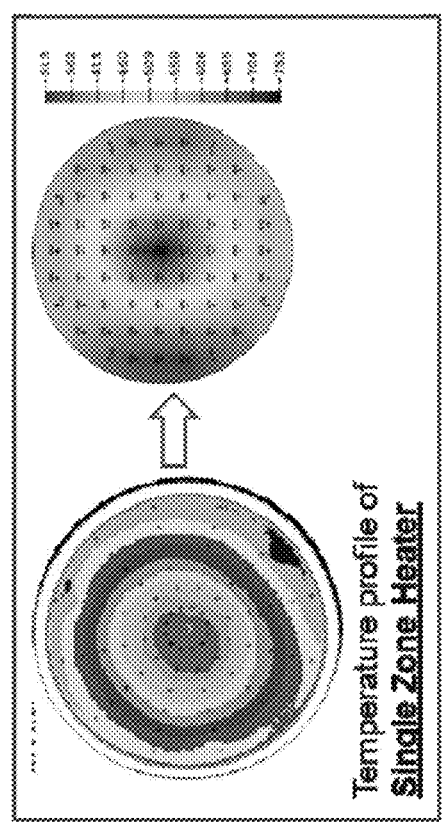
Figure 8:
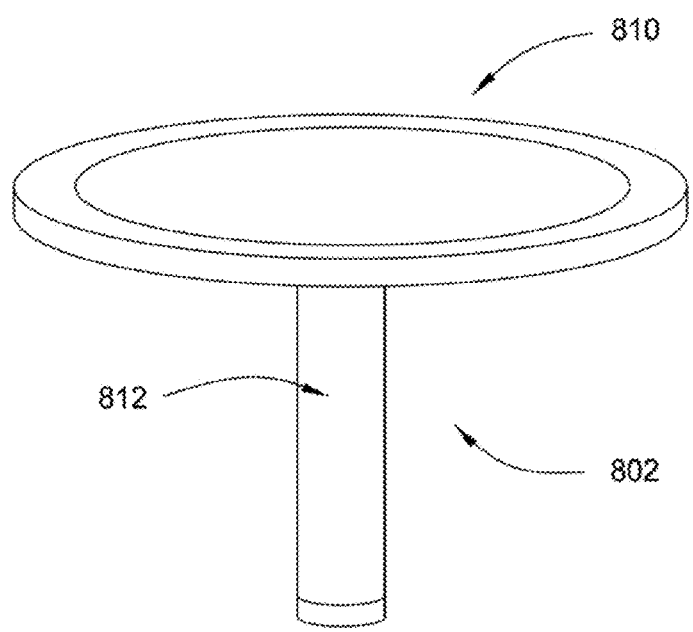
FIG. 8 is a perspective view of a dual zone heater according to some embodiments of the present disclosure.

In some embodiments, κ-range and local stress may be improved by unifying a center-to-edge temperature profile of the substrate by controlling the substrate temperature with a dual zone heater, corresponding to block 408 of FIG. 4. As described above, during a typical PECVD process of, for example, an α-C:H film, the center of the substrate may have a higher temperature than the edge of the substrate. In other words, temperature may decrease radially from the center of a substrate during a deposition process. Thermal uniformity (and κ-range minimization) of a substrate may be obtained using a dual zone heater. FIG. 8 is a perspective view of a dual zone heater 802 according to some embodiments of the present disclosure. As shown in FIG. 8, dual zone heater 802 has a plate 810 and stem 812. Plate 810 may comprise ceramic material. In some embodiments, plate 810 corresponds to pedestal 328 within chamber body 302 and stem 812 corresponds to stem 326 within chamber body 302. Plate 810 may comprise lift pins (not shown) to engage a lower surface of a substrate. The space between the Plate 810 and the substrate created by the lift pins allows, for example, a robot blade to engage a bottom surface of a substrate during an ex-situ substrate rotation process. Plate 810 is coupled with stem 812, wherein plate 810 is movably disposed within a processing volume 318 of the chamber body 302. Plate 810 may comprise two or more heating zones which may be configured to provide one or more temperatures across the surface of plate 810 and surface of a substrate. For example, face plate 810 may comprise a first heating zone and second heating zone, the second heating zone circumscribes the first heating zone. In other words, the second heating zone is disposed radially beyond the first heating zone. During a deposition process, the first heating zone may have a temperature different from the temperature of the second heating zone. The temperature of the first heating zone may be less than, equal to, or greater than the temperature of the second heating zone. Face plate 810 may comprise additional heating zones. Face plate 810 may comprise between about two to twenty heating zones, about two to ten heating zones, about two to four heating zones. In some embodiments, one of the heating zones is about 5 mm to about 200 mm from a center axis of the dual zone heater, about 90 to about 140 nm from a center axis of the dual zone heater, about 110 mm to about 120 mm from a center axis of the dual zone heater. The temperature of the two or more heating zones may be controlled by one or more heating coils (not shown) disposed in an arrangement along within plate 810. The heating coils may be configured to heat a first heating zone to a first temperature and a second heating zone to a second temperature. Alternatively, temperature of the two or more heating zones may be controlled by one or more fluid channels (not shown) configured to house a heating or cooling fluid. FIG. 2F illustrates the respective temperature profiles of a single zone heater and dual zone heater. As shown in FIG. 2F, a dual zone heater improves temperature uniformity by unifying a center-to-edge temperature profile, which reduces local stress and overlay non-uniformity by >50%.

Methods for modulating local stress and overlay error of one or more patterning films may include modulating a gas flow profile of gases introduced into a chamber body, flowing gases within the chamber body toward a substrate, rotating the substrate, and unifying a center-to-edge temperature profile of the substrate by controlling the substrate temperature with a dual zone heater. A chamber for depositing a film may include a chamber body comprising one or more processing regions. The chamber body may include a gas distribution assembly having a blocker plate for delivering gases into the one or more processing regions. The blocker plate may have a first region and a second region, and the first region and second region each may have a plurality of holes. The chamber body may have a dual zone heater. Methods and apparatus of the present disclosure may reduce overlay error within deposited multilayers and allow deposition of a material layer useful for integrated circuit fabrication which can be conformally deposited on substrates having topographic features. Methods and apparatus of the present disclosure may reduce overall processing time by eliminating lithographic and scanner based metrology steps, which, for example, reduces the amount of time needed to determine an optimal film composition.

While the foregoing is directed to embodiments of the present disclosure, other and further embodiments of the present disclosure may be devised without departing from the basic scope thereof, and the scope thereof is determined by the claims that follow.

What is claimed is:

1. A method of modulating local stress and overlay error of one or more patterning films, comprising:
   modulating a gas flow profile of gases via a blocker plate comprising a first region and a second region, wherein the first region and second region each have a plurality of holes, wherein the plurality of holes of the first region are spaced more closely relative to one another than the plurality of holes of the second region;
   introducing the gases into a chamber body through the holes of the first region of the blocker plate and the second region of the blocker plate;
   flowing the gases within the chamber body toward a first region and a second region of a substrate; and
   rotating the substrate after deposition of at least a partial film onto the substrate.

2. The method of claim 1, further comprising:
   unifying a center-to-edge temperature profile of the substrate by controlling the substrate temperature with a dual zone heater, wherein the dual zone heater comprises a first heating zone and a second heating zone, wherein the second heating zone circumscribes the first heating zone, and wherein a temperature of the first heating zone is different than a temperature of the second heating zone.

3. The method of claim 1, further comprising:
   monitoring film morphology across one or more of the patterning films with a metrology tool.

4. The method of claim 1, wherein rotating the substrate is performed ex-situ.

5. The method of claim 1, wherein the first region of the blocker plate is a center region and the second region of the blocker plate is an edge region.

6. The method of claim 1, wherein the substrate is rotated while supported by a shadow ring.

7. The method of claim 1, wherein the substrate is rotated 180°.

8. The method of claim 1, wherein a pressure within the chamber body is about 0.4T to about 10 T.

9. The method of claim 1, further comprising applying an RF voltage to a showerhead.

10. The method of claim 1, wherein the gases comprise one or more carrier gases selected from the group consisting of helium, argon, carbon dioxide, and combinations thereof.

11. The method of claim 10, wherein a flow rate of the carrier gas is between about 500 sccm to about 1,500 sccm.

12. The method of claim 1, wherein the gases comprise an oxidizing gas selected from the group consisting of $O_2$, $O_3$, $N_2O$, CO, and carbon dioxide.

13. The method of claim 12, wherein a flow rate of the oxidizing gas is between about 100 sccm to about 3,000 sccm.

14. The method of claim 1, wherein the gases comprise a hydrocarbon compound.

15. The method of claim 14, wherein a ratio of molar flow of diluent gas to molar flow rate of hydrocarbon gas is between about 2:1 and about 40:1.

16. The method of claim 14, wherein the hydrocarbon compound is a nitrogen-containing hydrocarbon, a fluorine-containing hydrocarbon, an oxygen-containing hydrocarbon, a hydroxyl-containing hydrocarbon, or a boron-containing hydrocarbon.

17. The method of claim 1, wherein the gases comprise krypton, xenon, or argon.

18. The method of claim 2, wherein the temperature of the first heating zone and the temperature of the second heating zone are maintained between about 100° C. and about 650° C.

19. The method of claim 1, wherein the modulating a gas flow profile of gases is further carried out via a showerhead comprising a first region and a second region, wherein the first region and second region each have a plurality of holes, wherein the first region comprises a higher density of the plurality of holes than a density of the plurality of holes of the second region.

20. The method of claim 1, further comprising:
unifying a center-to-edge temperature profile of the substrate by controlling the substrate temperature with a dual zone heater, wherein the dual zone heater comprises a first heating zone and a second heating zone, and wherein the second heating zone circumscribes the first heating zone.

* * * * *